US012644202B2

(12) United States Patent
Sadana et al.

(10) Patent No.: US 12,644,202 B2
(45) Date of Patent: Jun. 2, 2026

(54) LITHIATION OF POROUS-Si FOR HIGH PERFORMANCE ANODE

(71) Applicant: POSI ENERGY-SILICON POWER. LLC, Pleasantville, NY (US)

(72) Inventors: Devendra K Sadana, Pleasantville, NY (US); Joel P. de Souza, Putnam Valley, NY (US); Brian Williams, Hillsborough, NJ (US); Francis Christopher Farmer, Cherry Hill, NJ (US)

(73) Assignee: Devendra K Sadana, Pleasantville, NY (US)

( * ) Notice: Subject to any disclaimer, the term of this patent is extended or adjusted under 35 U.S.C. 154(b) by 768 days.

(21) Appl. No.: 17/952,247

(22) Filed: Sep. 24, 2022

(65) Prior Publication Data

US 2024/0102201 A1     Mar. 28, 2024

(51) Int. Cl.
| | |
|---|---|
| *C30B 33/08* | (2006.01) |
| *C30B 29/06* | (2006.01) |
| *H01M 4/02* | (2006.01) |
| *H01M 4/36* | (2006.01) |
| *H01M 4/38* | (2006.01) |
| *H01M 4/66* | (2006.01) |
| *H01M 10/0525* | (2010.01) |
| *H01M 10/0562* | (2010.01) |
| *H01M 10/0568* | (2010.01) |
| *H01M 10/0569* | (2010.01) |

(52) U.S. Cl.
CPC .............. *C30B 33/08* (2013.01); *C30B 29/06* (2013.01); *H01M 4/366* (2013.01); *H01M 4/386* (2013.01); *H01M 4/661* (2013.01); *H01M 10/0525* (2013.01); *H01M 10/0562* (2013.01); *H01M 10/0568* (2013.01); *H01M 10/0569* (2013.01); *H01M 2004/021* (2013.01); *H01M 2300/0028* (2013.01); *H01M 2300/008* (2013.01)

(58) Field of Classification Search
CPC ......... H01M 10/0525; H01M 10/0562; H01M 10/0569; H01M 10/0568; H01M 4/66; H01M 4/38; C30B 29/06; C30B 33/08
See application file for complete search history.

(56) References Cited

U.S. PATENT DOCUMENTS

| | | | |
|---|---|---|---|
| 6,900,114 | B2 | 5/2005 | Ohmi et al. |
| 7,368,332 | B2 | 5/2008 | Moriwaki et al. |
| 8,889,295 | B2 | 11/2014 | Yushin et al. |
| 10,581,109 | B2 | 3/2020 | de Souza et al. |
| 10,644,356 | B2 | 5/2020 | de Souza et al. |
| 10,777,842 | B2 | 9/2020 | de Souza et al. |
| 2017/0098823 | A1 | 4/2017 | Yushin et al. |
| 2019/0115625 | A1 | 4/2019 | Sadana et al. |
| 2019/0214082 | A1 | 7/2019 | Li et al. |
| 2020/0014018 | A1 | 1/2020 | de Souza et al. |
| 2020/0014058 | A1 | 1/2020 | de Souza et al. |
| 2020/0014059 | A1 | 1/2020 | de Souza et al. |
| 2020/0014060 | A1 | 1/2020 | de Souza et al. |
| 2020/0020895 | A1 | 1/2020 | Collins et al. |
| 2020/0335826 | A1 | 10/2020 | Collins et al. |
| 2020/0403190 | A1 | 12/2020 | Collins et al. |
| 2022/0223848 | A1 | 7/2022 | Sadana |

FOREIGN PATENT DOCUMENTS

| | | |
|---|---|---|
| WO | WO2011156419 A2 | 12/2011 |
| WO | WO2017093074 A1 | 6/2017 |
| WO | WO2019077426 A1 | 4/2019 |
| WO | WO2020008285 A1 | 1/2020 |

*Primary Examiner* — Sarah A. Slifka
(74) *Attorney, Agent, or Firm* — Thomas A. Beck

(57) ABSTRACT

An element to be used as an anode in a lithium-ion battery comprising a lithiated single crystal porous-silicon layer made on the surface of a p-doped single crystal Si of thickness 25-1000 mm and resistivity of less than 0.01-ohm cm. Successful lithiation is achieved either electrochemically or by direct alloying of lithium metal with the porous-Si with a wide range of porosities. The lithiated silicon anode allows a high cathode loading in a lithium-ion battery resulting in record current densities without the formation of lithium dendrites.

15 Claims, 3 Drawing Sheets

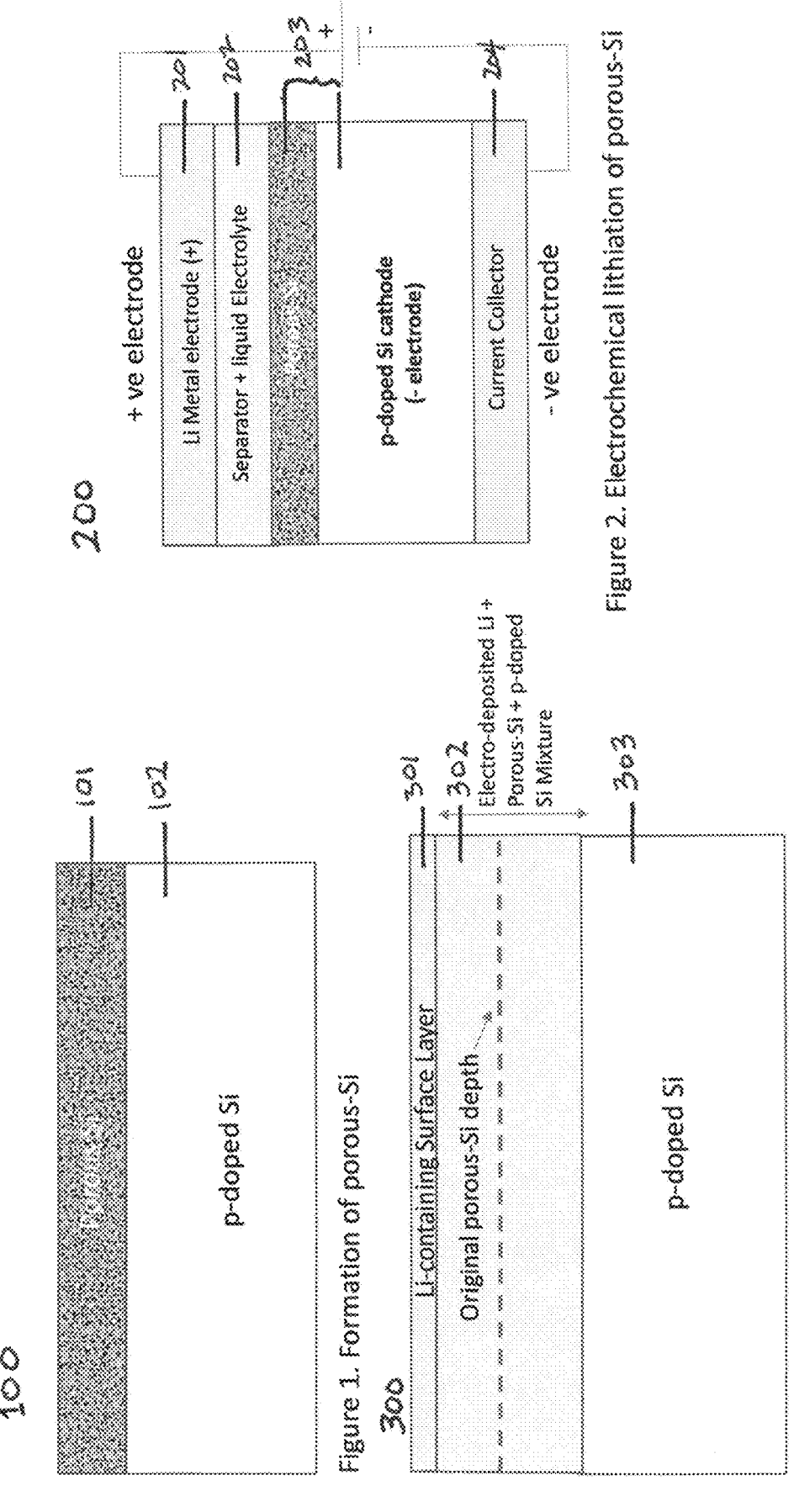
Figure 1. Formation of porous-Si
Figure 2. Electrochemical lithiation of porous-Si
Figure 3. The Si anode structure after the electrochemical lithiation shown in Figure 2

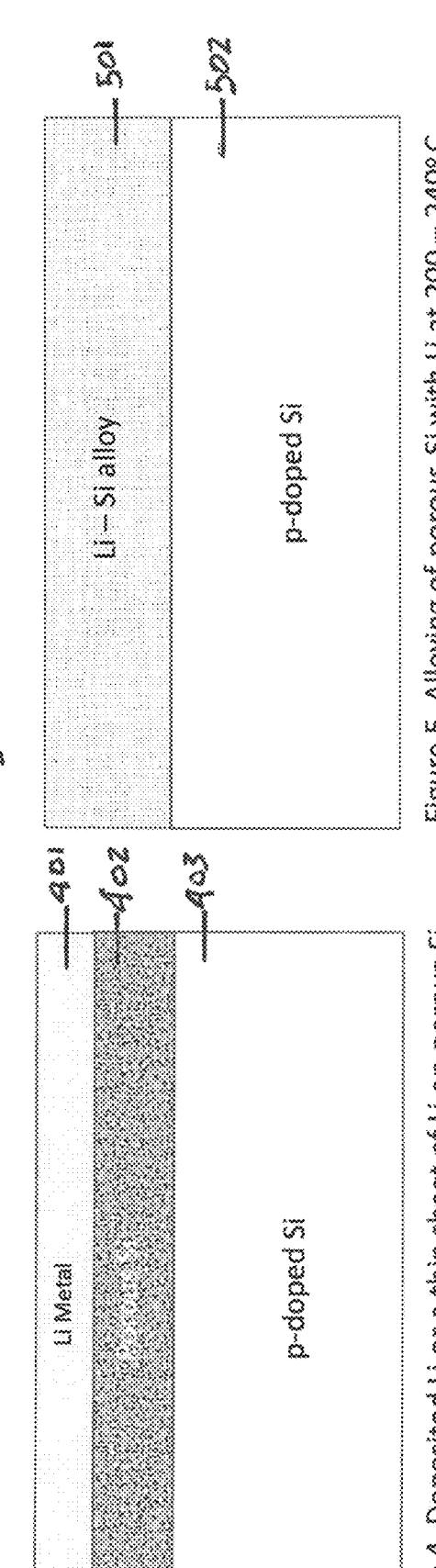
Figure 5. Alloying of porous-Si with Li at 200 – 240° C
Figure 4. Deposited Li or a thin sheet of Li on porous-Si

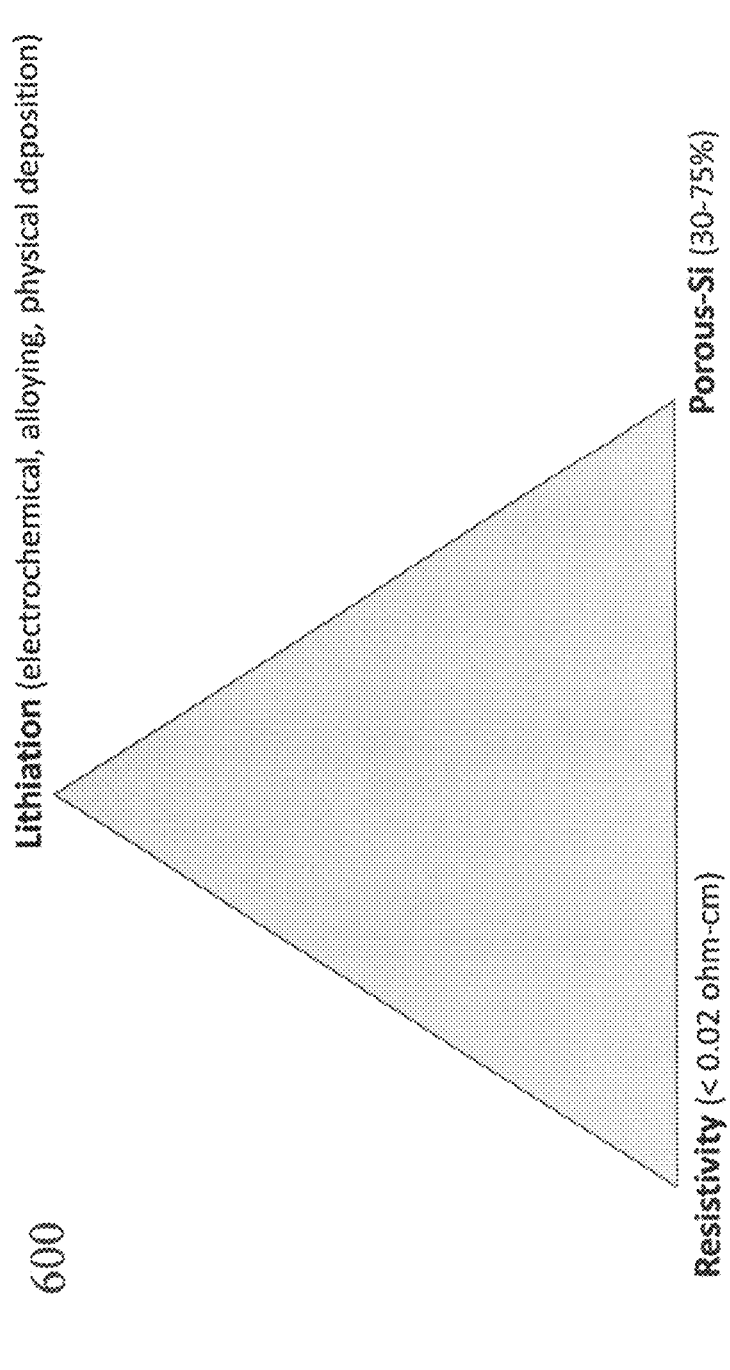
600
Figure 6. The inventive high performance Si anode battery works only when the resistivity, porosity, and lithiation conditions are satisfied. In the absence of satisfying any of the three parameters, the Si anode performance will degrade. Preferred ranges of the parameters: resistivity – 0.005 – 0.001 ohm cm, porosity – 35-40%, lithiation – 1 mA/cm², 1-5 hours.

LITHIATION OF POROUS-Si FOR HIGH PERFORMANCE ANODE

FIELD OF THE INVENTION

The present invention relates to lithium-ion batteries (LIB), and more particularly, within said batteries, to a novel, high-performance, long-life Si anode via lithiation of single crystal porous-Si/p-Si material.

BACKGROUND OF THE INVENTION

Lithium batteries can charge and discharge many times, are generally stable, and have high energy densities per weight and volume.

In some embodiments, anodes in lithium-ion batteries are made from silicon (Si), specifically a silicon powder that has small crystalline silicon particles in random orientations packed together with graphite powder. There are voids/spaces among these particles. Lithium is stored within the silicon and graphite particles (which have a high absorption for the lithium) and in the voids/spaces. Silicon possesses a high specific capacity of 4200 mAh/g (corresponding to $Li_{4.4}Si$), which is more than 10 times that of commercially used graphite (372 mAh/g). When silicon is used as an anode material and is exposed to a lithiation process by which lithium is incorporated into the silicon anode, there is a volume expansion of about 300%, which causes cracking and pulverization of the Si anode, resulting in the loss of mechanical/electrical contact and subsequent capacity fading.

As batteries get older and efficiency decreases, they enter a "capacity fade," which occurs when the amount of charge a battery could once hold, begins to decrease with repeated use. The capacity of a lithium-ion battery directly correlates to the amount of lithium-ions that can be shuttled back and forth as the device is charged and discharged. As the functioning battery is cycled, some of those ions get stripped out of the cathode material and end up at the battery's anode.

In some embodiments, the prior art uses thick silicon substrates that are porous. The silicon substrates have long deep pores with large average pore diameters to increase the surface area (e.g., the surface area of the pore walls) of the silicon exposed to lithium within the silicon substrate.

In some embodiments, the pores in the silicon substrates have large spaces between them so that there is space for the lithiated silicon substrate, as noted above, to expand and contract during charge and discharge cycling. These types of porous silicon substrate can form long nanowire-type lithiated silicon structures within the silicon substrate during charging. Accordingly, while increasing lithium storage per silicon substrate volumes (due to the increased porous surface area exposed to lithium), these silicon substrates increase the amount of lithium intercalation and structural failures of these substrates.

To store large amounts of lithium and improve the energy density of these batteries (e.g., both in micro-batteries and larger batteries, like power packs), the cathodes are loaded with at least 10 mg/cm² cathode material with a thickness of greater than 30 microns in thickness. For example, the larger the cathode loading, the larger the amount of e.g., lithium 88 (Lithium Iron Phosphate $LiFePO_4$) in the battery anode.

During a discharge cycle, when the battery is connected to an external circuit load, electrons flow from the anode through the circuit load and back to the cathode. Generally, the lithium metal atoms diffused in and/or in contact with the anode, lose an electron and become lithium-ions in, on, or near the anode and silicon substrate. These lithium-ions then move through the battery, e.g., through the battery electrolyte, creating an (lithium-ion) ionic current. Reaching the cathode, lithium-ions intercalate into the cathode lattice and are reduced by electrons provided from the load circuit.

During a charging cycle, the ionic current reverses in the battery. A charging power source removes electrons from the lithium compounds at the cathode to create lithium-ions at/in the cathode region. In the charging cycle, these lithium-ions migrate through the electrolyte as lithium-ionic current back to the anode and accumulate at anode surface or intercalate in the anode lattice where they become reduced by the electrons provided by the charging power source.

The accumulation of lithium metal at the anode and electrochemical processes within the battery causes a potential difference across the battery between the anode and cathode that enables the battery to produce a current through an external load during the next discharge cycle.

Lithium is alloyed or intercalated at a high concentration in these prior art anode substrates, e.g., silicon substrates. A combination of intercalation (reversible inclusion or insertion of a molecule or ion into a material layer, i.e., is positioned in a matrix of an anode material without forming an alloy) and alloying creates large volume changes in the silicon substrate during the charge and discharge cycles. These volume changes cause battery failure due to silicon substrate cracking, battery leakage of internal components, contaminants entering the battery, internal shorting of battery components, etc. Depending on the anode used, the lithium-ion either intercalates (e.g., sits in a matrix of an anode material without forming an alloy) or forms an alloy.

Other failure modes include lithium dendrite growth into and from the substrate which also causes component shorting, substrate weakening, cracking, contamination, battery leakage, etc.

More specifically, with respect to the present invention, there are a number of patents and publications in the prior art that are directed specifically to Li-ion batteries that contain a Si anode. These patents disclose the structure of a porous-Si/p-Si anode, including single crystal porous-Si/p-Si anode with conventional liquid electrolytes, a solid state (polymer) electrolyte; porous-Si/p-Si anode used in microbattery structures; and a publication disclosing a single crystal porous-Si/p-Si anode with catholytes. There are also methods disclosed for forming said porous-Si/p-Si anode, e.g., using a RCA clean as a pre-requisite. There are single crystal porous-Si/p-Si anodes that are used in a fast charge rate (low capacity) battery containing a ceramic electrolyte (LiPON).

The single crystal porous-Si/p-Si anode structure defined in one prior art reference is severely limited in scope. It has a specific two-layer structure with a very top layer (<100 nm or so) with low porosity (<30%) as the nucleation layer for Li plating and a higher porosity 2nd layer beneath the top low porosity layer. It specifically avoids using any porosity >30% to damage the Si anode during the battery cycling.

Two features of significance in obtaining an efficient Si-porous anode are lithiation and the Si-porous anode doping level and resistivity. Although electrochemical lithiation has been practiced in the prior art, its application was limited to single crystal porous-Si/p-Si of low porosity (<40%).

In one prior art reference, only the doping level of Boron is mentioned (~$10^{19}$ cm³). Although 109 cm³ doping level should typically give Si resistivity of 0.005 ohm·cm, that resistivity is not guaranteed. It depends on the crystal quality.

Therefore, a doping level without a specific resistivity value can be challenged. The single crystal porous-Si/p-Si in the prior art typically used resistivity >0.01 ohm·cm. This can cause a high internal resistance in the battery.

BRIEF SUMMARY OF THE INVENTION

In addressing the above-mentioned deficiencies found in the prior art, it has been discovered that a combination of lithiation and low-resistivity opens up a wide structural and process window to create a successful single crystal porous-Si/p-Si/p-Si anode. Also, the invention does not require a nucleation layer of <30% porosity as stipulated in the prior an.

Embodiments of this invention include improvements to various configurations of lithium batteries that have a cathode made of a lithium containing material, an anode, and an electrolyte/separator between the cathode and anode, wherein the anode includes a conductive anode current collector made of a material non-reactive with lithium. The present invention also includes methods for making the improved lithium batteries.

The anode of the present invention is formed with a wide range of porosities as well as with a wide range of single crystal porous-Si/p-Si thicknesses in a p-type Si.

After formation, the anode is subsequently lithiated with a wide range of lithiation conditions resulting in a robust anode structure that outperforms the state-of-the art graphite or Li metal anode-based lithium-ion batteries (LIBs).

In accordance with the present invention, the porosity range is broadened up to about 75%. It has been experimentally determined that lithiation of a single crystal porous-Si/p-Si/p-Si anode creates a new paradigm in that it makes a wide range of methods to produce single crystal porous-Si/p-Si/p-Si with a wide range of porosities as well as thicknesses become possible anode structures for lithium-ion batteries.

It has been experimentally determined that the resistivity of a single crystal porous-Si/p-Si/p-Si anode is the most important aspect which may have prevented the successful formation of single crystal porous-Si/p-Si/p-Si anode in the prior art. The present invention has established that low resistivity (<0.01 ohm·cm) in conjunction with lithiation play a critical role in making the single crystal porous-Si/p-Si anode of the present invention work effectively with a wide range of porosities.

BRIEF DESCRIPTION OF THE DRAWINGS

Various embodiments of the present invention will be described below in more detail, with reference to the accompanying drawings, now briefly described. The Figures show various apparatus, structures, devices, and related method embodiments of the present invention and invention uses.

FIG. 1 is a block diagram of a cross section elevation of elements of an anode used in a battery, wherein the anode per se is formed with a wide range of porosities as well as with a wide range of single crystal porous-Si/p-Si thicknesses.

FIG. 2 is a block diagram of a cross section elevation of a half-cell of a lithium-ion battery, e.g., an energy storage device, where the porous Si is disposed on a conductive current collector as a cathode during electrochemical lithiation by a Li metal anode.

FIG. 3 is a block diagram of a cross section elevation of the microstructure of the electrochemically lithiated single crystal porous-Si/p-Si.

FIG. 4 is a block diagram of a cross section elevation of a single crystal porous-Si/p-Si anode to be lithiated by alloying with a lithium metal layer FIG. 5 is a block diagram of a cross section elevation of a lithiated single crystal porous-Si/p-Si anode used in a battery, e.g., an energy storage device, wherein a Li—Si alloy is atop a p-doped Si.

FIG. 6 shows schematically the equal significance of three key parameters: resistivity of a p-doped Si, porosity of Si and lithiation a single crystal porous-Si/p-Si. Which must be simultaneously present to achieve a high-performance lithium-ion battery with a Si anode.

THE PREFERRED EMBODIMENTS

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing.

This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The devices, structures, and methods disclosed in accordance with embodiments of the present invention can be employed in applications in the semiconductor and electronics applications like hardware and/or electronic systems including but are not limited to, personal computers, communication networks, electronic commerce systems, portable communications devices (e.g., cell and smart phones), internet-of-things (IoT), solid-state media storage devices, expert and artificial intelligence systems, functional circuitry, neural networks, etc.

However, uses are also found in other high energy density larger energy storage systems including battery powered vehicles (e.g., cars, trucks, boats, trains, etc.); energy storage for housing, office buildings, and other structures; and industrial power storage including storage of intermittent power generation (e.g., wind and solar power generation); etc.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "disposed on", "positioned on" or "positioned atop" mean that a first element is present on a second element, wherein intervening elements may be present between the first element and the second element.

As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers or formed electrochemical layers, present between the first element and the second element. It is understood that these terms might be affected by the orientation of the device described. For example, while the meaning of these descriptions might change if the device was rotated upside down, the descriptions remain valid because they describe relative relationships between features of the invention.

Embodiments of this invention include various cathode structures in various lithium battery embodiments also having various anode structures with different porosities.

Embodiments enable plating and stripping of a lithium metal layer on an anode surface, e.g., a smooth anode surface and/or an anode nucleation surface (porous surface).

In alternative embodiments, the nucleation can be one or more thin semiconductor, e.g., silicon, layers, including but not limited to a single crystal porous Si surface, disposed on a conductive current collector.

The porous layer in the anode enables a lithium metal layer to form above it and easily vary (grow and shrink) in thickness during battery charge and discharge cycles with no or a minimum of lithium intercalation.

In some embodiments, the porous anode layer facilitates nucleation of a lithium seed layer formation that in turn facilitates formation of a lithium metal layer or lithium layer.

In some embodiments, the smoothness of the single crystal porous-Si/p-Si surface inhibits or prevents dendrite growth on/in the anode and therefore prevents battery deterioration and/or the electrical shorting of internal battery components, e.g., shorting to the cathode and electrolyte.

As used herein, "plating" means deposition of lithium metal and/or lithium atoms/ions to form a lithium metal layer of variable thickness upon a surface. "Stripping" means the removal of lithium atoms/ions and electrons from the lithium metal layer causing the lithium metal layer to shrink. Plating causes the lithium metal layer to grow (become thicker), for example, during charging or during the Li electroplating process. Stripping decreases the thickness of the lithium metal layer as lithium atoms (lithium-ions and associated electron) leave the lithium metal layer, e.g., during discharging.

This disclosure describes various embodiments that provide anode surfaces and thicknesses that repeatedly permit lithium metal layers to form (grow during charging and shrink during discharging cycles) with minimal or no mechanical failure effects on battery components or significant dendrite growth.

"Uniform" plating means that a lithium metal layer plated on a surface is a predominantly continuous lithium layer across the entire area of a surface. This lithium layer can be wavy and non-uniform in thickness or the thickness can be constant over the entire surface.

It is thought that this uniform plating of the lithium metal layer, e.g., on the single crystal porous-Si/p-Si layer, prevents or largely inhibits dendrite formation, particularly when the surface of the lithium metal layer is smooth. The semiconductor layer(s) used as porous layers are smooth.

In some embodiments of the present invention, an anode is made by disposing a thin, crystal semiconductive layer on a conductive current collector layer.

The semiconductive layer has a porous surface on which lithium nucleates, e.g., the lithium nucleates to first form a lithium seed layer on/in the semiconductor surface. A lithium metal layer then forms uniformly/continuously across the entire surface of the semiconductor layer, e.g., on the seed layer on/in the semiconductive layer. The lithium metal layer will grow and shrink during the charge and discharge cycling of the battery.

In some embodiments, the semiconductor layer is made from single crystal silicon. Accordingly, the semiconductor layer used as a nucleation layer will be referred to as a nucleation layer, silicon layer, crystal silicon layer, or single crystal silicon layer, etc. without loss of generality, even though other semiconductor materials and structures are envisioned for making the semiconductor layer.

In addition, because of the smoothness of the silicon layer, the lithium metal layer will have a smooth surface and be uniformly/continuously spread over the semiconductor surface. As a result, dendrite formation will be greatly reduced or eliminated.

In some embodiments, the semiconductor nucleation layer is porous with pores of such a size to enable a lithium seed layer formation that helps the more efficient formation of the lithium metal layer.

Larger, e.g., thicker, cathodes with higher loading, e.g., $>20$ mg/cm$^2$ can provide more lithium for the higher current densities enabled in these anodes with greater energy densities. However, thicker cathodes, while providing more lithium, can decrease the charging and discharging rates of the battery because of the increased time the lithium takes to migrate through the thicker cathode during charge/discharge cycles.

Embodiments are disclosed that use cathode thicknesses thin enough to enable fast battery charging while maintaining high current densities in the anode region.

The resistivity of the anode in conjunction with its lithiation are the two most important characteristics in the present invention.

Battery resistance includes both the ionic resistance and electronic resistance. Ionic resistance refers to the resistance of Li-ions in the electrolyte, the resistance of lithium-ions through the SEI film, and the charge transfer resistance of lithium-ions and electrons at the active material/SEI film interface, and the solid phase diffusion resistance of lithium-ions inside the active material.

Electronic resistance refers mainly to the resistance of positive and negative active materials, current collector resistance, contact resistance between active materials, contact resistance between active materials and current collector.

The separators used in the present invention must be chemically and electrochemically stable to the electrolyte and electrode materials in Li-ion batteries since the separator itself does not participate in any cell reactions. Separators for conventional, planar Li-ion batteries are typically solid micro-porous polyolefin films.

As a critical component inside Li-ion batteries, separators should be mechanically strong to withstand the high tension during the battery assembly as well as charging and discharging cycles. Typically, separators in commercial lithium-ion batteries have found to be formed from polyethylene and polypropylene.

The current collector works as electrical conductor between the electrode and external circuits as well as a support for the coating of the electrode materials.

Detailed Description of the Preferred Embodiments

The invention embodies a novel, high-performance, long-life Si anode that is formed via lithiation of single crystal porous-Si/p-Si. While Si is the preferred semi-conductive material for use as the anode, and will be selected herein for descriptive purposes, other porous crystalline semi-conductive materials include germanium, silicon-germanium and III-V compounds can be used.

FIG. 1 depicts elements consisting of a porous layer of Si 101 is formed having porosities ranging between about 30% and 75% and having a layer thickness of between about 50 nanometers (nm) and 50 micrometers, preferably 5-10 micrometers disposed atop a p-doped Si substrate 102. FIG. 1 elements form a part of the lithium-ion battery depicted in FIG. 2.

These combined layers form what is referred to as a "half-cell" because there is no cathode to form the battery. There is only a Li anode.

In the half-cell of the present invention, the single crystal porous Si/p-Si functions as a cathode during the lithiation process, but in a full cell, the lithiated single crystal porous-Si/p-Si/p-Si functions as an anode. In the case of said half-cell, the electrochemical potential between the Li and Si electrodes is practically zero.

The p-Si substrate 102 in this invention is heavily doped and typically has resistivity of <0.01 ohm·cm. The preferred resistivity range is 0.01-0.002 ohm·cm. The single crystal porous-Si/p-Si is prepared by anodic etching. The etching can be effected using several different HF-containing solutions.

For example, the requisite porosity is obtained by anodic etching of p-Si substrate with a 40-50% concentrated HF solution. Optionally, the p-Si substrate can be electrochemically etched with a concentrated HF mixed with water and ethanol in a 1:1:1 ratio by volume, or a concentrated HF and ethanol in a 4:6 ratio.

Anodic etching of p-Si in the aforementioned solutions resulted in single crystal porous-Si surface of different porosities. The concentrated HF only solution resulted in the lowest porosity (<35%) whereas HF-Ethanol (4:6 ratio) solution resulting in the highest porosity (>70%).

In the prior art, lithiation of the single crystal porous-Si/p-Si structure created by concentrated HF only solution was preferred.

This resulted in a two-layer single crystal porous-Si/p-Si structure with a low-porosity (<30%) layer forming in the surface region especially when a specific surface clean was performed prior to the anodic etching.

The porosity of Si is controllably varied from 30 to 75% in the present invention without the need of a specific surface clean prior to anodic etching. For example, both inorganic (RCA type clean) and organic cleans (hot acetone, hot dimethylformamide etc.) can be used without affecting the quality of the lithiated single crystal porous-Si/p-Si anode. Experimentally, it has been shown that after electrochemical lithiation of the single crystal porous-Si/p-Si with a wide range of porosities, the anode performance is normalized such that all such Si anodes have a similar performance independent of their initial porosity. This is an unexpected result.

Furthermore, the prior art was focused on developing a bilayer porous structure with the top 30 nm of the low-porosity layer (<30%) to act as a seed for lithium plating during the lithiation process.

In the current invention, it was found that a thin low-porosity Si layer at the surface is not a necessary requirement. Si anodes with porosities ranging from 30-75% with the porous-Si thicknesses ranging from 3-10 μm gave a similar anode performance after the lithiation.

In addition to the lithiation, the other important parameter that affects the anode performance is the resistivity of the p-Si substrate which should be less than 0.01 ohm·cm. Higher substrate resistivity leads to higher internal resistance of the lithium-ion battery and degraded battery performance.

FIG. 2 at 200 depicts the end-product of an electrochemical lithiation process of the present invention with respect to the Si product depicted in FIG. 1 The Li-ion product depicted in FIG. 2 comprises a Li metal anode layer 201 having a thickness of between about 50 and 200 μm positioned intermediately above a separator and a liquid electrolyte layer 202 which in turn is atop the elements of the Si cathode 101 and 102 depicted in FIG. 1. Element 101 atop element 102, collectively 203, are positioned atop a current connector 204 during the electrochemical lithiation of the Si cathode.

Various types of electrolyte/separators 202 are envisioned. The electrolyte 202 can be in a liquid or solid-state form. Non-limiting examples of solid-state electrolyte 202 materials include, polymer electrolytes, sulfide solid electrolytes (SSEs), argyrodite electrolytes, sulfur containing electrolytes like $Li_6PS_5Cl$, and lithium phosphorous oxynitride (LiPON) ceramic type electrolytes.

The Li metal electrode 201 is disposed on the electrolyte/separator 202. The Li metal electrode is made of either pure Li metal or lithium containing compounds that has thickness of between about 50 and 200 μm. Any known Li metal electrode material 201 that is a source for lithium is envisioned.

Non-limiting examples of the Li metal containing cathode material include lithium salts, such as lithium cobalt oxide (LCO), nickel manganese cobalt oxide (NMC), lithium iron phosphate (LFP), and compounds generally designated as NCA, which am composed of the cations of the chemical elements: lithium, nickel, cobalt and aluminum. The most important representatives have the general formula $LiNi_xCo_yAl_zO_2$ wherein x+y+z=1, and halides, such as LiI (lithium iodide), etc.

Generally, the thicker the Li metal containing cathode material, the more is the cathode loading and larger amount of lithium is available in the battery 200. Typically, a cathode loading of <20 mg/cm$^2$ is used to avoid the formation Li dendrites during the battery charge-discharge cycling.

The current collector for the anode can be nickel or copper.

The lithiated single crystal porous-Si/p-Si anode show a battery performance that far exceeds any other anode for the lithium-ion battery including both the graphite and Li anodes.

For example, the lithiated single crystal porous-Si/p-Si anode of the present invention allows for high areal current density (>10 mAh/cm$^2$) that is not possible or attainable by any existing lithium-ion battery because of the dendrite formation. The capacity fade with the lithiated single crystal porous-Si/Si anode comprising layer 101 can be controlled to <0.05% per cycle even at high cathode load (>40 mg/cm$^2$) which creates an areal current density of >8 mAh/cm$^2$ under the optimized lithiation process. In the absence of lithiation, typical capacity fade of the single crystal porous-Si/p-Si anode is 0.1-0.2% per charge/discharge cycle due to the Li consumption during the Solid Electrolyte Interphase (SEI) formation and other reactions.

In Li-ion batteries, "Capacity fade" is an effect to be considered, Capacity fade is caused by a loss of active cathode material (loss of storage medium). For example, if the cathode material becomes unstable at high potentials, it can no longer store a charge. Both the graphite and Li metal anodes either fail after a few charge/discharge cycles or show a pronounced capacity fade (>0.2% per cycle) with the high cathode loading. The electrode/electrolyte interface is affected by the formation of a so-called solid electrolyte interphase (SEI) layer. The SEI layer is a passivating film that appears at the first instance when the battery undergoes initial charging cycling. The SEI layer is formed as a result of electrolyte decomposition products. SEI appears to prevent uncontrolled Li-intercalation in the anode.

FIG. 2 depicts a battery connecting Li and Si in such a way that allows Li to flow to Si during the lithiation process. The structure of FIG. 3 after the lithiation is unique.

The key feature of the lithiated single crystal porous-S/p-Si anode depicted in FIG. 3 resides in its unique structure which contains the following continuous layers: (i) a Li-rich surface layer with SEI, (ii) a layer comprising a mixture of Li+Si alloys where a porous-Si layer previously existed, and (iii) lithiated Si in the p-Si substrate that is consumed during the lithiation process.

During the electrodeposition of the Li, the integrity of the Si anode structure is maintained. Furthermore, this structure remains intact during charging/discharging for hundreds of cycles with a very low-capacity fade.

More particularly, FIG. 3 depicts elements of a lithium-ion battery 300 containing a Si anode having a first layer which is a SEI layer 301 having a composition that typically comprises one or more Li$_2$CO$_3$, LiF, and Li$_2$O compounds, said layer 301 having a thickness of between about 20 nm to 20 μm. Layer 301 is positioned atop layer 302 which comprises a mixture of electro-deposited Li and porous Si having a porosity of between about 30% and 75%, and lithiated Si in the p-substrate beneath the porous-Si with an overall thickness of between about 10 μm and 50 μm, preferably 30 μm.

Layer 302 is situated atop a p-doped Si layer substrate 303 that has a layer thickness of between about 5 μm and 1000 μm, preferably 25 μm-200 μm. The layer of the p Si element 303 that is doped with Boron (B) has concentrations of >10$^{18}$ cm$^{-3}$, and typically has resistivity of <0.01 ohm·cm. The resistivity of p-doped Si layer 303 is less than 0.01 ohm·cm. The preferred resistivity range is 0.01-0.001 ohm·cm. The composition of layer 302 is formed by combining a porous Si having the properties of porous Si layer 101 described with respect to FIG. 1; and the Li mixture is an alloy that comprises primarily elements Li, Si, with the addition of a small percentage of unintentional contaminants, such as C, N, H, OH, and F. A portion of the p-Si immediately beneath the porous-Si/p-Si is also consumed during the lithiation process.

The composition of p-doped Si layer 303 possesses the properties of the p-doped Si layer described with respect to Si layer 102 depicted in FIG. 1.

The structure of the lithiated single crystal porous-Si/p-Si by scanning electron microscopy (SEM) shows two regions: a surface region with SEI/Li rich material followed by a Li—Si region which contains the consumed porous-Si as well as a portion of the p-Si immediately below the porous-Si that apparently reacted with lithium during the lithiation process. This is shown schematically in FIG. 3. This unique structure provides a robust and long-lasting anode material for LIBs.

Electrochemical lithiation was performed on porous-Si/p-Si anodes with the porosity range of 30-75% and LIBs worked in all cases. This allows a very wide process window for forming a robust and high performance porous-Si/p-Si anode in conjunction with electrochemical lithiation.

This electrochemically lithiated anode is compatible with all the commercial cathodes as well as liquid, polymer, and ceramic electrolytes used by the LIB industry.

Methods to Form a Porous-Si/p-Si Anode

The porous-Si/p-Si anode of the present invention is formed by an anodic etching process wherein the top surface of a p-doped silicon substrate acts as an anode and a Pt or other metals that do not react with HF serve as a cathode in a HF-containing electrolyte.

Boron doped p-Si with a nominal doping of >5×10$^1$ cm$^{-3}$ and a preferred doping of 10$^{19}$ cm$^{-3}$ with corresponding resistivity value of <0.01 ohm·cm is required to obtain uniform porosity and low internal resistance of the anode. The preferred resistivity value is about 0.005-0.001 ohm·cm.

The porosity in such p-doped Si is controlled by the composition of the electrolyte solution from 30-75%, For low porosity Si (<40%) the electrolyte consists of concentrated HF only (40-50% by volume).

For high porosity Si (>40%) the concentrated HF solution is mixed either with just a surfactant, such as ethanol, dimethylformamide, acetic acid, etc., or with a surfactant plus water in various proportions.

The anodic etching is performed from about 100 seconds to about 7200 seconds (2 hours) at a current density of about 1 mA/cm$^2$ to about 150 mA/cm$^2$. The resulting porous-Si/p-Si thickness ranges from about 1 μm to about 200 μm with a porosity range of <30% to >70%.

In some embodiments a thin chemical silicon oxide is grown after the porous-Si/p-Si process to further enhance the anode performance. For example, the capacity fade of the lithiated porous-Si/p-Si anode during charge/discharge cycles can be further reduced by up to 50% compared to that obtained without the oxide. In a preferred embodiment the oxide is grown chemically using one of the following oxidizer chemicals: HNO$_3$, H$_3$PO$_4$, KNO$_3$ solution, H$_2$SO$_4$ etc. Typically, the formation a chemical silicon oxide is self-limiting to a thickness of <2 nm.

Lithiation of Porous-Si/p-Si

Lithiation of porous-Si/p-Si of the present invention is achieved by first making a half-cell with the Li metal as the anode and porous-Si/p-Si as the cathode as shown in FIG. 2.

A constant current in the range of 1-10 mA/cm$^2$ is passed between the Li anode and porous-Si/p-Si cathode through a typical liquid electrolyte consisting of dimethyl carbonate (DMC), diethyl carbonate (DEC), and ethyl carbonate (EC) for a time duration of 15 minutes to 10 hours, preferably 1-5 hours at a constant current of 1 mA/cm$^2$ A combination of constant current, e.g., 1 mA/cm$^2$ for 1 hour+4 mA/cm$^2$ for 1 hour (total lithiation time=2 hours) or 2 mA/cm$^2$ for 2.5 hours, or other current density combinations can also be used to increase the throughput of the lithiation process.

The total thickness of the deposited Li should preferably be slightly greater than the Li consumed from the cathode in forming the SEI (solid electrolyte interphase) to offset the loss of the consumed Li. A step-by-step process for electrochemical lithiation is as follows:

1. A single crystal p-Si substrate (having a doping of ~10$^{19}$ cm$^{-3}$, and resistivity ~0.005 ohm·cm) is cleaned in well-known inorganic and organic solvents such as hot acetone, dimethylformamide etc, or other suitable chemical cleaning that is typically used in the Si IC industry;
2. The p-Si anode is etched in a 40-50% concentrated HF with or without a surfactant such as ethanol, acetic acid, dimethylformamide etc., to form a porous-Si/p-Si region at the surface;
3. A half-cell with a Li-metal anode and said p-Si as the cathode is formed with a typical liquid electrolyte and a separator;
4. A lithiation process is performed on the single crystal porous-Si/p-Si cathode via a constant current (range 1-10 mA/cm$^2$) to obtain 5-100 μm of Li deposition on the porous-Si/p-Si surface;
5. A coin cell or a pouch cell is fabricated with the lithiated Si anode.

It should be noted that alternative methods for electrochemical lithiation can be applied for Li deposition.

With a current density of 1 mA/cm$^2$, Li is shown to deposit at a rate of approximately 8 μm per hour. For high cathode loading of >20 mg/cm$^2$ the target electroplated Li thickness is greater than 20 μm.

The lithiated single crystal porous-Si/p-Si anode in a lithium-ion battery can provide areal capacities of >8 mAh/cm$^2$ anode at a cathode loading of >40 mg/cm$^2$ with the initial-capacity fade of <0.03% per charge/discharge cycle during the first 100 cycles at a C/10 or lower charge/discharge rate which is well beyond what any state-of-the-art anodes can provide.

As noted, lithium from the cathode material deposits in situ onto the lithiated single crystal porous silicon/p-Si anode during charging resulting in the growth of Li metal on the lithiated surface. The entire Li that deposited on the lithiated Si surface contributes to the battery capacity. During the discharge cycle, the Li ions return to the cathode.

Alternative Lithiation Processes

Lithiation has also been achieved successfully by alloying the Li metal directly onto the porous-Si/p-Si surface.

FIG. 4 depicts elements of lithium-ion battery 400, having a layer of a Li metal sheet 401 having a layer thickness between about 10 μm and 200 μm, preferably, 50-100 μm, atop porous layer of Si 101, 402 having porosities ranging between about 30% and 75% preferably 30-60%, and having a layer thickness of between about 1 and 50 μm preferably 5-10 μm positioned atop a layer of p-doped Si.

In the process of forming the elements depicted in FIG. 4, a Li metal sheet is placed above the porous-Si/p-Si surface and is heated on a hot plate in an Ar glove box. The Li is pressed over the porous-Si/p-Si anode. When the hot plate temperature reached >200° C. is pressed Si—Li alloying begins to occur. The alloying is performed in the temperature range of 220-280° C. Various Li—Si compounds can form per Li—Si phase diagram including $Si_3Li_8$, $Li_{22}Si_5$, $Li_{13}Si_4$, $Li_7Si_3$ and $Li_{12}Si_7$.

FIG. 5 depicts at 500 the resulting lithiated and alloyed anode 501 having a thickness of between about 5 μm and 50 μm, preferably >10 μm, atop the p-doped Si described with respect to 102/501 in FIG. 1

FIG. 5 shows that the Si—Li alloyed structure is equivalent to that obtained by the electrochemically lithiated Si.

However, unlike the controlled Li deposition obtained by the electrochemical lithiation, Li deposition on the porous-Si/p-Si surface via alloying has much higher run-to-run variation. It is also possible to obtain Li deposition on the porous-Si/p-Si surface by evaporation or by sputtering assuming all safety protocols have been properly met.

Other methods of Li deposition but not limited to vacuum evaporation and sputtering are also envisioned. The thickness range of Li deposition is the same as already described above for the electrochemical lithiation. Both vacuum and sputtering depositions will require appropriate safety protocols so that the Li is never exposed to an air or any oxidizing environment during the entire deposition process and subsequent formation of lithium-ion batteries.

The present invention comprises a high-performance lithium-ion battery with a capacity fade of ~0.03% per cycle during the first 100 cycles at a C/10 or lower charge/discharge rate with twice or higher cathode loading (>50 mg/cm$^2$) than conventionally used. This results in an unprecedented areal capacity of >10 mA·h/cm$^2$ which is not attainable by either a Li metal or a ubiquitously used graphite anode.

At such a cathode loading both Li and graphite anode show 5-10 times higher capacity fade than that of the Si anode with a rapid battery failure in <100 charge/discharge cycles due to the formation of Li dendrites. It is stipulated that by using a thin Si anode (~15 μm) in conjunction with a high cathode loading the energy density of a lithium-ion battery can be increased to >500 Wh/kg. The best lithium-ion battery performance is currently limited to <300 Wh/kg.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments.

FIG. 6 shows schematically the equal significance of three key parameters in the present invention, namely (i) a p-doped Si substrate of resistivity of <0.01 ohm·cm, (ii) porosity of Si in the range of 30-75%, and (iii) lithiation of the porous-Si/p-Si. All these three parameters have to be simultaneously present in order to achieve a high-performance lithium-ion battery with a Si anode. The absence of any of the parameter will result in degraded performance of a lithium-ion battery with a Si anode.

The terminology used herein was chosen to best explain the principles of the embodiments, the practical application or technical improvement over technologies found in the marketplace, or to enable others of ordinary skill in the art to understand the embodiments disclosed herein.

Devices, components, elements, features, apparatus, systems, structures, techniques, and methods described with different terminology that perform substantially the same function, work in the substantial the same way, have substantially the same use, and/or perform the similar steps are contemplated as embodiments of this invention.

What we claim and desire to protect by Letters Patent is:

1. An electrochemically lithiated single crystal porous-Si/p-Si alloyed anode comprising:
    a first layer which is a solid electrolyte interphase (SEI) layer comprising a composition having a plurality of lithium compounds selected from $Li_3CO_3$, LiF, and $Li_2O$, said layer having a thickness of between about 20 nm to 20 μm, said first layer being positioned atop a second layer;
    said second layer comprises an Li—Si alloy mixture of electro-deposited Li and porous Si having a porosity of between about 30% and 75%, and a portion of a reacted p-Si immediately underneath said porous-Si, having an overall thickness of between about 10 μm and 50 μm;
    said second layer being situated atop a p-doped Si layer substrate that has a layer thickness of between about 5 μm and 1000 μm;
    said p-doped Si layer is doped with Boron (B), has concentrations in excess of $5 \times 10^{18}$ cm$^{-3}$, has a resistivity value of <0.01 ohm·cm, and a thickness of between about 10 μm and 1000 μm.

2. The electrochemically lithiated single crystal porous Si/p-Si alloyed anode defined in claim 1 wherein the composition of said second layer comprises primarily elements Li, Si, with the addition of an amount of unintentional contaminants, selected from C, N, H, OH, and F, the presence of which will not adversely affect the utility of said second layer.

3. The electrochemically lithiated single crystal porous Si/p-Si alloyed anode defined in claim 1 wherein said second layer has a thickness between about 50 μm-100 μm and has porosities between about 30% and 75%.

4. The electrochemically lithiated single crystal porous Si/p-Si alloyed anode defined in claim 1 which is situated atop and in contact with a liquid electrolyte-soaked separator which in turn is situated atop and in contact with a cathode made of Li-containing material;
    wherein said anode is connected to a Cu or Ni current collector and said cathode is connected to a Al current collector.

5. The electrochemically lithiated single crystal porous Si/p-Si alloyed anode defined in claim 4 wherein said Li metal containing cathode material includes lithium compounds salts, selected from lithium cobalt oxide (LCO), nickel manganese cobalt oxide (NMC}, lithium iron phosphate (LFP), Lithium Nickel Cobalt Aluminum (NCA), and halides, selected from LiI (lithium·iodide).

6. The electrochemically lithiated single crystal porous Si/p-Si alloyed anode defined in claim 5 that contains a liquid electrolyte-soaked separator is selected from dimethyl carbonate (DMC), diethyl carbonate (DEC), and ethyl carbonate (EC).

7. The electrochemically lithiated single crystal porous Si/p-Si alloyed anode defined in claim 6 wherein said liquid electrolyte-soaked separator is replaced by polymer electrolytes, sulfide solid electrolytes (SSEs), argyrodite electrolytes, sulfur containing electrolytes, $Li_6PS_5Cl$, and lithium phosphorous oxynitride (LiPON) ceramic type electrolytes.

8. The electrochemically lithiated single crystal porous Si/p-Si alloyed anode as defined in claim 6 comprising a Li—Si alloy having a thickness of between about 5 μm and 50 μm, atop a p-doped Si substrate having a doping value of $>5 \times 10^{18}$ cm$^{-3}$, a resistivity of less than 0.01 ohm·cm and a thickness between about 10 μm and 1000 μm.

9. The electrochemically lithiated single crystal porous Si/p-Si alloyed anode defined in claim 4 wherein said cathode has a loading of <20 mg/cm$^2$.

10. The electrochemically lithiated single crystal porous Si/p-Si alloyed anode defined in claim 4 wherein said lithiated single crystal porous-Si/p-Si anode possesses a high areal current density of >8 mAh/cm$^2$ and the capacity fade with said lithiated porous Si anode is controlled to <0.05% per cycle at a C/10 or lower rate at high cathode load of >40 mg/cm·2 which creates an areal current density of >8 mAh/cm$^2$.

11. The electrochemically lithiated single crystal porous Si/p-Si alloyed anode defined in claim 4 has a capacity fade of approximately 0.03% per cycle during the first 100 cycles at a C/10 or lower charge/discharge rate with a cathode loading greater than 40 mg/cm$^2$ resulting in an areal capacity of greater than 8 mAh/cm$^2$ with a $LiNi_{0.8}Mn_{0.1}Co_{0.1}O_2$ cathode material.

12. The electrochemically lithiated single crystal porous Si/p-Si alloyed anode defined in claim 4 comprising said Si anode having a thickness of approximately 50 μm and a cathode loading of more than 30 mg/cm$^2$, the cell level energy density of said lithium-ion battery is increased to more than 400 Wh/kg.

13. The electrochemically lithiated single crystal porous Si/p-Si alloyed anode defined in claim 4 wherein the lithiation occurred on a porous-Si surface with a range of porosities between about 35% and 75%, and a thickness of between about 50 nm and 50 μm and the resulting lithiated Si anode structure contains a Li-containing SEI layer, lithiated porous Si, and a portion of substrate Si forming Li-Si alloys, having addition contaminants therein, selected from C, N, H, OH, and F.

14. The electrochemically lithiated single crystal porous Si/p-Si alloyed anode as defined in claim 1 wherein said Li—Si alloy thickness is greater than 10 μm.

15. The electrochemically lithiated single crystal porous Si/p-Si alloyed anode as defined in claim 1 wherein said porous-Si, has an overall thickness of between about 10 μm and 50 μm.

* * * * *